(12) United States Patent
Koenenkamp

(10) Patent No.: US 7,659,165 B2
(45) Date of Patent: Feb. 9, 2010

(54) METHOD OF FABRICATING A FIELD EFFECT TRANSISTOR

(75) Inventor: Rolf Koenenkamp, Portland, OR (US)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 241 days.

(21) Appl. No.: 10/532,190

(22) PCT Filed: Oct. 29, 2003

(86) PCT No.: PCT/DE03/03673

§ 371 (c)(1),
(2), (4) Date: Apr. 21, 2005

(87) PCT Pub. No.: WO2004/040616

PCT Pub. Date: May 13, 2004

(65) Prior Publication Data

US 2006/0118975 A1    Jun. 8, 2006

(30) Foreign Application Priority Data

Oct. 29, 2002   (DE)  ................................ 102 50 984

(51) Int. Cl.
*H01L 21/336* (2006.01)

(52) U.S. Cl. ........................ 438/257; 438/259; 438/263; 257/314; 257/315

(58) Field of Classification Search ................ 438/257, 438/259, 263, 265; 257/314, 315, 316, 324
See application file for complete search history.

(56) References Cited

U.S. PATENT DOCUMENTS

| 6,379,569 | B1 * | 4/2002 | Rouberol ..................... 216/13 |
| 6,465,806 | B2 * | 10/2002 | Kubota et al. .................. 257/72 |
| 6,515,325 | B1 | 2/2003 | Farnworth et al. .......... 257/530 |
| 6,753,546 | B2 * | 6/2004 | Tzalenchuk et al. ........... 257/31 |
| 7,176,620 | B2 * | 2/2007 | Tsujimura et al. ........... 313/506 |
| 7,259,023 | B2 * | 8/2007 | Kuo et al. ...................... 438/3 |

(Continued)

FOREIGN PATENT DOCUMENTS

DE    19846063    4/2000

(Continued)

OTHER PUBLICATIONS

Engelhardt R. et al.: Growth of Compound Semiconductors in Nanometer Sized Channels of Polymers; Mat.Res.Soc.Symp.Proc. vol. 672 (2201) pp. 08.8.1-O8.8.6.

(Continued)

*Primary Examiner*—Phuc T Dang
(74) *Attorney, Agent, or Firm*—Darby & Darby

(57) ABSTRACT

A field effect transistor in which at least one vertically arranged semiconductor column, with a diameter in the nanometer range, is located between a source and a contact and has an annular surround of a gate contact with retention of an insulation gap. A simplified production method is disclosed and the transistor produced thus is embodied such that the semiconductor columns are embedded in a first and a second insulation layer, between which a metal layer, running to the outside as a gate contact, is arranged, the ends of which, extending upwards through the second insulation layer, are partly converted into an insulator, or removed and replaced by an insulation material.

7 Claims, 4 Drawing Sheets

U.S. PATENT DOCUMENTS

2002/0001905 A1    1/2002    Choi et al. .................. 438/268
2003/0132461 A1    7/2003    Roesner et al. ............. 257/233

FOREIGN PATENT DOCUMENTS

| DE | 100 36 897 C1 | 1/2002 |
|---|---|---|
| DE | 10036897 | 1/2002 |
| GB | 2222306 | 2/1990 |

OTHER PUBLICATIONS

Seung Chul Lyu et al. "Low-Temperature Growth of ZnO Nanowire Array by a Simple Physical Vapor-Deposition Method", Chem. Mater., 2003, 15 (17), pp. 3294-3299.

K.B.K Teo et at "PECVD Carbon Nanotubes/Nanofibers - How uniform do they grow?", TNT2002, Sep. 9-13, 2002, Santiago de Compostela-Spain, (2 pages).

R. Engelhardt and R. Koenenkamp, "Electrodeposition of Compound Semiconductors in Polymer Channels of 100 nm Diameter", J. Appl. Phys., vol. 90, No. 8, Oct. 15, 20.01, pp. 4288-4289.

Mark S. Gudiksen et al. "Diameter-Selective Synthesis of Semiconductor Nanowires", J. Am. Chem. Soc., 2000, 122 (36), pp. 8801-8802.

R. Koenenkamp et al. "Thin film semiconductor deposition on freestanding ZnO columns", Applied Physics Letters, vol. 77, No. 16, 16 Oct. 2000, pp. 2575-2277.

\* cited by examiner

METHOD OF FABRICATING A FIELD EFFECT TRANSISTOR

This application is a 371 of PCT/DE03/03673 Oct. 29, 2003.

BACKGROUND OF THE INVENTION

1. Field of the Invention

The invention relates to a field effect transistor provided with a vertically oriented semiconductor column of a diameter in the nanometer range (nano-wire) disposed between a source electrode and a drain electrode and annularly surrounded at an insulating space by a gate electrode as well as to a method of its fabrication.

2. The Prior Art

Thin layer transistors are known in which semiconductor material is deposited in a planar arrangement on flexible substrates. However, mechanical stresses on the substrates easily lead to a release of the semiconductors from the substrate or to other damages and, hence, to functional failure.

It has already been proposed to fabricate transistors of the nanometer range by the formation of ion trace channels by ion bombardment in a foil composite consisting of two plastic foils and an intermediate layer of metal and by sensitizing the ion trace channels for subsequent etching. Semiconductor material is injected into the etched micro-holes by electro deposition or chemical bath precipitation. Source electrodes and drain electrodes are formed by subsequently metalizing the upper and lower surface of the foil compound. The center layer of metal serves as the gate electrode.

The advantage of the cylindrical and vertical arrangement of these transistors is the mechanical robustness since the foil is flexible and extensible. Moreover, the organic foil material is substantially softer than the inorganic semiconductor material. As a result, occurring bending, shear and compressive forces are almost completely absorbed by the foil material so that under bending, flexing and tensile forces the characteristic curve of the transistor and other electrical parameters remain substantially constant.

Since micro-holes can be fabricated down to 30 nm and filled with semiconductor material, transistors on the nanometer scale can be fabricated without lithography and without any masking technique.

Depending upon the type of precipitation of the semiconductor material, the process leads to polycrystalline semiconductor columns. The ration of length to diameter of the semiconductor columns is also limited by the required crystal growth within the micro-holes. Overall, the method of fabricating the transistors is still too complex since hitherto the ion bombardment can be carried out only in select scientific environments.

OBJECT OF THE INVENTION

It is an object of the invention to provide a field effect transistor of the type initially referred to which can be fabricated with monocrystalline semiconductor columns even without ion irradiation. A suitable simple and industrially applicable method of its fabrication is to be provided in connection therewith.

SUMMARY OF THE INVENTION

In accordance with the invention, the object is accomplished by the characteristics of claims 1 and 2. Useful embodiments are the subject of the sub-claims.

In accordance therewith, the semiconductor columns are embedded in a first and in a second insulating layer between which there is provided a metal layer extending outwardly as a gate electrode. The ends of the metal layer which upwardly extend through the insulating layer are partially converted to an insulator or partially removed and replaced by an insulating material.

Such a transistor can be fabricated by the following method steps:

free-standing semiconductor columns are grown vertically on a conductive substrate;

a first insulating layer is deposited on the semiconductor columns;

onto which a first conductive metal layer and a second insulating layer are deposited thereafter;

the resulting laminate is etched planar to the point of removing the portion of the first metal layer covering the semiconductor columns;

the ends of the metal layer penetrating to the surface of the laminate are etched back in accordance with their metal and a third insulating layer is deposited on the laminate whereupon the laminate is again etched planar;

or the ends of the metal layer penetrating to the surface are converted to an insulator by oxidation or nitriding;

finally depositing a second metal layer on the laminate.

Compared to current vertical nano-transistors, the transistor offers the following advantages:

The structure of the field effect transistor allows for an extremely high packing density and extremely small dimensions without any need to apply lithographic processes.

The substrates used may be rigid or flexible.

Ion beams are not necessarily required for the fabrication.

The process makes possible the growth of mono-crystalline semiconductor columns. Transistors with mono-crystalline semiconductors have higher switching rates than those with poly-crystalline semiconductors.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

Figure 6:
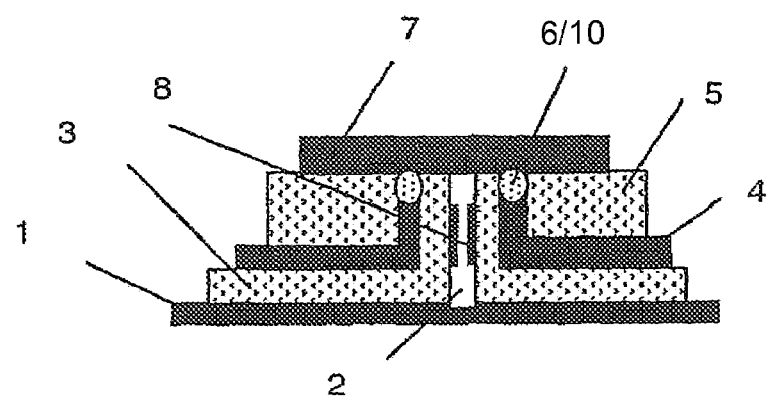
Figure 5A:
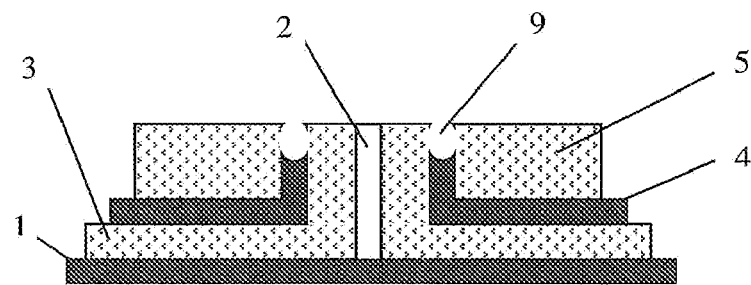
Figure 5B:
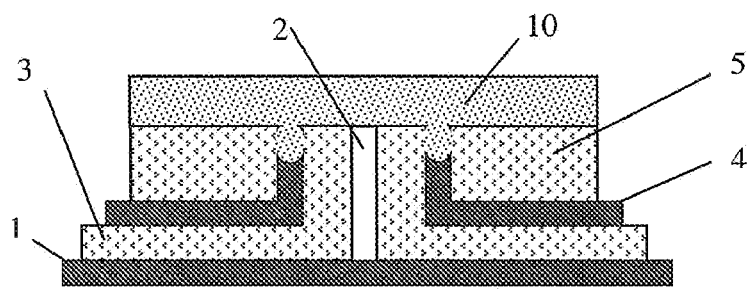
Figure 5C:
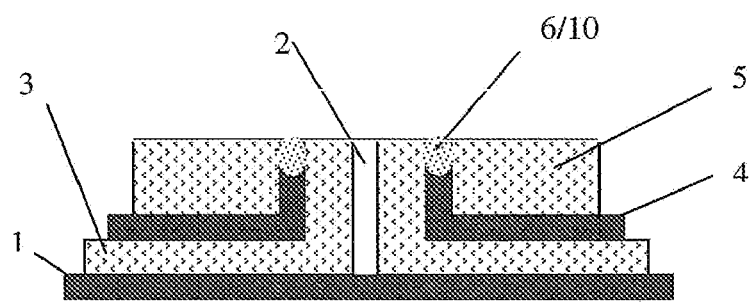
Figure 7:
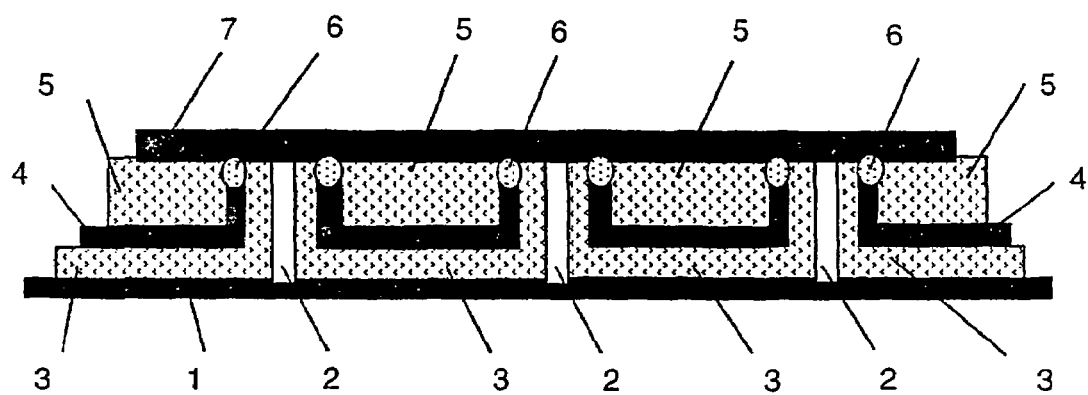

FIGS. 5A-C depicts the sixth method step—insulating the ends of the upwardly penetrating metal layer;

FIG. 6 depicts the seventh method step—depositing a second metal layer, a cross-section of the completed structure of the transistor; and FIG. 7 depicts a cross-section of an array of transistors which can be fabricated in accordance with the method.

DESCRIPTION OF THE PREFERRED EMBODIMENTS

Figure 1:
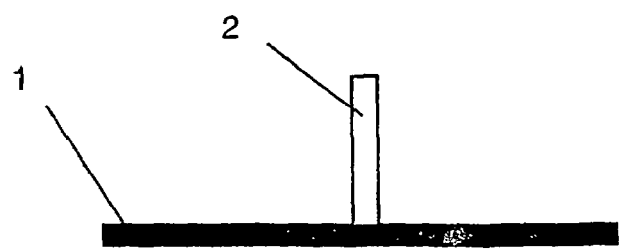
FIG. 1 depicts the first method step of fabricating a field effect transistor in accordance with the invention—growing of the free-standing semiconductor columns on a metallic conductive substrate.

As shown in FIG. 1, vertically free-standing semiconductor columns 2 are initially grown on a conductive substrate 1 which may be flexible or rigid. This may be carried out by an unordered process as known, for instance, from /1/ in respect of the electro-chemical growth of ZnO-columns. Alternatively, ZnO could be deposited by vaporizing Zn or ZnO, see /2/. However, it is also possible so to prepare that in an ordered or unordered fashion nuclei are generated from which the columnar growth proceeds. Ni-dots, for instance, may be used for growing ZnO-columns /2/or Ni-dots may be used for the vertical growth of C60-nano-tubes, see /3/, Fig. D. Ordered nuclei may be generated by lithographic methods, see /3/or by non-lithographic methods, such as, for instance, dislocation stages of misaligned crystal surfaces. In the case of non-lithographically fabricated nuclei the size limitations inherent in lithography do not apply. The columnar growth is solely determined by the size of the nucleus. Semiconductor columns may, however, also be produced in etches ion trace channels of polymer films. Free-standing semiconductor columns are also formed after subsequent removal of the foil material, see /4/.

The semiconductor columns (nano-fibers/nano-tubes) grown on the substrates have hitherto gained importance chiefly for the construction of structural components for electron field emission, luminescence diodes and solar cells with an extremely thin absorption layer.

Aside from the materials mentioned for the semiconductor columns, such materials as GaP, see /5/, InAs, CdTe and others may also be used.

Figure 2:
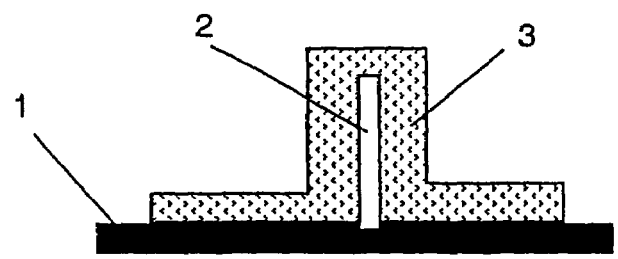
FIG. 2 depicts the second method step—depositing a first insulating layer.

As shown in FIG. 2, an insulating layer 3 is deposited after the semiconductor columns 2 have been grown. The deposition may be carried out by spin-coating of a polymer or by vaporization, DVD (chemical vapor deposition) or other known processes of forming an insulating layer, such as, for instance, an oxide or nitride.

Figure 3:
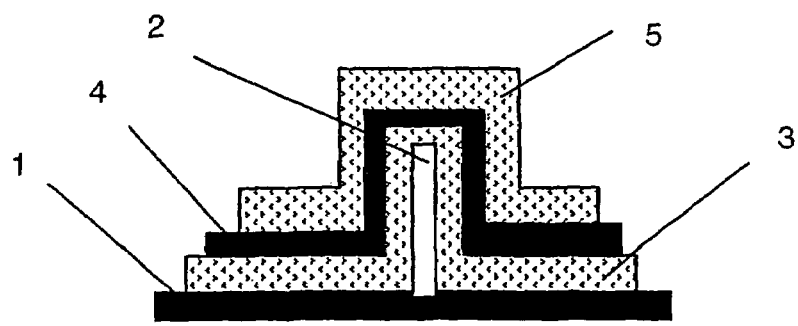
FIG. 3 depicts the third and fourth method step—depositing a first meal layer and a second insulating layer.
Figure 4:
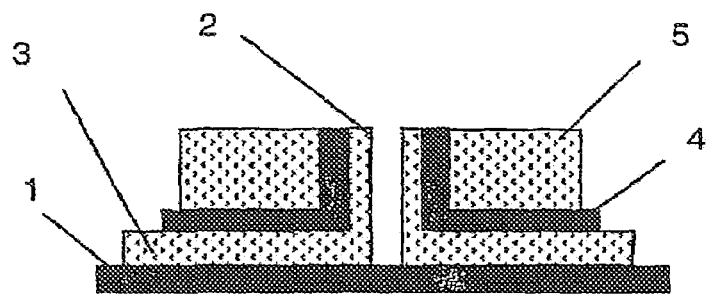
FIG. 4 depicts the fifth method step—planar etching.

The insulating layer 3 also covers the side surfaces of the semiconductor columns 1. A first conductive metal layer 4, which later on constitutes the gate electrode of the transistor, is deposited on the insulating layer 3 by sputtering, vaporization, chemical vapor deposition or a similar process. Thereafter, a further insulating layer 5 is deposited (FIG. 3), and the upper layer of the laminate formed in this manner is etched planar (FIG. 4). This may be done by a horizontal ion beam (ion beam etching) or by plasma, chemical or electro-chemical etching processes of the kind sufficiently known in semiconductor technology. Thereafter, the upwardly penetrating ends of the metal layer 4 are insulated. This may be carried out by etching back the metal protruding to the surface by a metal-specific etching step (FIG. 5A) and by applying a further insulating layer 10 (FIG. 5B) which is planarized in turn (FIG. 5C). Alternatively, as shown in FIG. 5C, the metal protruding to the surface may be converted to an insulator 6 by chemical oxidizing or nitriding. Finally, a second metal layer 7 is deposited (FIG. 6). This metal layer is electrically connected to the semiconductor column, and later on it serves as source electrode and drain electrode.

In the area of the center contact which acts as a gate electrode, a channel 8 is formed at the outside of the semiconductor column 2 which, provided the semiconductor column 2 is sufficiently thin, may extend over the entire thickness of the column.

FIG. 7 depicts an array of transistors. The gate electrode always surrounds the semiconductor column 2 in an annular fashion and is, overall, continuous. All electrodes (source, drain, gate) may be controlled as an array or they may be divided by lithographic processes. Such arrays may be used in control circuits and displays. In an array, several hundreds of transistors are combined as an optical pixel.

The method allows fabrication of transistors with semiconductor columns in the range of 10 to 500 nm diameter. The heights of the semiconductor columns lie in the same range. At very small diameters, the transistor may be operated in a quantum regime.

LIST OF LITERATURE CITED

/1/ Koenenkamp et al.: Thin Film Deposition on Free-standing ZnO Columns; Appl. Phys. Lett. 77, No. 16 (16 Oct. 2000), pp. 2275-2277.
/2/ Seung Chu Lyu et al.: Low Temperature Growth of ZnO Nano-wire Array Using Vapour Deposition Method, Chemistry of Materials, to be published.
/3/ Teo et al.: Nanotech Conference, Santiago de Compostela, Sep. 9-13, 2002-10-09.
/4/ Engelhardt, Koenenkamp: Electrodeposition of Compound Semiconductors in Polymer Channels of 100 nm Diameter; J. Appl. Phys., 90, No. 8 (15 Oct. 2002), pp. 4287-4289.
/5/ Gudiksen/Lieber: Diameter-Selective Semiconductor Nanowires, J. Am. Chem. Soc. 122 (2000), pp. 8801-8802.

LIST OF REFERENCE CHARACTERS USED

1 Substrate
2 Semiconductor Column
3 Insulating Layer
4 Metal Layer
5 Insulating Layer
6 Insulator
7 Metal Layer
8 Channel

The invention claimed is:
1. A method of fabricating a field effect transistor in which at least one vertically aligned semiconductor column of a diameter in the nanometer range is present between a source electrode and a drain electrode and is annularly surrounded by a gate electrode with an insulating space between them,
   the method comprising:
      free-standing semiconductor columns are grown vertically on a conductive substrate;
   a first insulating layer is deposited on the semiconductor columns;
   a first conductive metal layer and a second insulating layer are deposited thereon;
   the developing laminate is etched planar to the point of the portion of the first conductive metal layer covering the semiconductor columns is removed again;
   the end of the first conductive metal layer penetrating to the surface of the laminate are etched back in a metal-specific manner and a third insulating layer is deposited on the laminate with subsequent renewed planar etching;
   or
   the ends of the first conductive metal layer penetrating to the surface of the laminate are converted to an insulator by oxidizing or nitriding; and
   finally depositing a second conductive metal layer on the laminate.

2. The method of claim 1, wherein the laminate or individual layers are divided into individual arrays by a lithographic process.

3. The method of claim 1, wherein the growing of the semiconductor columns is carried out electro-chemically.

4. The method of claim 1, wherein the growing of the semiconductor columns is carried out by sputtering.

5. The method of claim 1, wherein the growing of the semiconductor columns is carried out by a CVD process.

6. The method of claim 1, wherein the growing of the semiconductor columns is carried out by vaporization.

7. The method of claim 1, wherein the growing of the semiconductor columns is carried out in ion trace channels of a polymeric film which is subsequently removed.

* * * * *